United States Patent [19]

Ho et al.

[11] 4,381,953
[45] May 3, 1983

[54] POLYSILICON-BASE SELF-ALIGNED BIPOLAR TRANSISTOR PROCESS

[75] Inventors: Allen P. Ho, Poughkeepsie, N.Y.; Cheng T. Horng, San Jose, Calif.

[73] Assignee: International Business Machines Corporation, Armonk, N.Y.

[21] Appl. No.: 293,771

[22] Filed: Aug. 17, 1981

Related U.S. Application Data

[62] Division of Ser. No. 133,155, Mar. 24, 1980.

[51] Int. Cl.³ .................... H01L 21/263; H01L 21/22
[52] U.S. Cl. .................................. 148/1.5; 29/576 B; 148/187; 357/34; 357/59; 357/91
[58] Field of Search ............... 148/1.5, 187; 29/576 B; 357/34, 59, 91

[56] References Cited

U.S. PATENT DOCUMENTS

| | | | |
|---|---|---|---|
| 4,157,269 | 6/1979 | Ning et al. | 148/1.5 |
| 4,234,362 | 11/1980 | Riseman | 148/187 |
| 4,305,760 | 12/1981 | Trudel | 148/1.5 |
| 4,313,255 | 2/1982 | Shinozaki et al. | 148/1.5 |

OTHER PUBLICATIONS

Yeh, T. H., IBM-TDB, 22, (1980), 4047.

Primary Examiner—Upendra Roy
Attorney, Agent, or Firm—Wesley DeBruin

[57] ABSTRACT

Disclosed is a process for forming an improved bipolar transistor in a silicon substrate of a first conductivity type, said silicon substrate having a planar surface, a subcollector region of a second conductivity type formed in said substrate, an epitaxial layer of said second conductivity type formed on said planar surface of said substrate, and first, second and third spaced apart recessed oxide isolation regions extending from the planar surface of said epitaxial layer into said substrate, a subcollector reach-through region positioned between said second and third recessed oxide isolation regions, said subcollector reach-through region extending from said planar surface of said epitaxial layer to said subcollector region, said process including the following steps: deposit, using chemical vapor deposition techniques, a layer of doped polysilicon on the exposed surface of said substrate said dopant being of said first conductivity type; deposit, using chemical vapor deposition techniques a first layer of silicon dioxide on said polysilicon layer; deposit a layer of photoresist on said first layer of silicon dioxide; utilizing photolithography, mask off an intended intrinsic base region, said intended intrinsic base region being spaced between said first and second recessed oxide isolation regions; utilizing the resist layer as a mask employ reactive ion etching to remove the silicon dioxide and polysilicon superimposed over the intended intrinsic base region; ion implant the exposed intrinsic base region with ions of said first conductivity type; chemically vapor deposit a relatively thick silicon dioxide conformal coating on the exposed surface; reactive ion etch an emitter opening on the epitaxial surface above the implanted intrinsic base; ion implant the emitter region with ions of said second conductivity type; and utilize a single heat cycle to anneal the ion implantations and drive in the emitter, intrinsic base, extrinsic base and collector reach through.

1 Claim, 19 Drawing Figures

POLYSILICON-BASE SELF-ALIGNED BIPOLAR TRANSISTOR PROCESS

CROSS REFERENCE TO RELATED APPLICATIONS

This is a division of application Ser. No. 133,155 filed Mar. 24, 1980.

U.S. patent application Ser. No. 98,588, entitled "A Self-Aligned Micrometer Bipolar Transistor Device and Process" filed Nov. 29, 1979 by Cheng T. Horng et al, granted as U.S. Pat. No. 4,303,933 on Dec. 1, 1981.

U.S. patent application Ser. No. 224,705 (division of Ser. No. 98,588, filed Nov. 29, 1979) entitled "Process for Fabricating a Self-Aligned Micrometer Bipolar Transistor Device" filed Jan. 12, 1981 by C. T. Horng et al, granted as U.S. Pat. No. 4,333,277 on June 8, 1982.

U.S. patent application Ser. No. 133,156 entitled "Method of Making High Performance Bipolar Transistor with Polysilicon Base Contacts", filed Mar. 24, 1980 by C. G. Jambotkar, granted as U.S. Pat. No. 4,319,932 on Mar. 16, 1982.

An application filed under the PCT and given Ser. No. 79/01137, entitled "Method For Achieving Ideal Impurity Base Profile In A Transistor", filed Dec. 28, 1979 by B. L. Crowder et al.

FIELD OF THE INVENTION

The present invention relates to processes for the fabrication of very small integrated bipolar transistors, in which doped polysilicon is used for the base contact, and in which a self-aligned contact to the emitter is realized.

BACKGROUND OF THE INVENTION AND PRIOR ART

Numerous integrated circuit devices, structures and techniques of fabricating same, are known to the prior art. The following prior art patents and summaries are submitted to generally represent the state of the art.

Reference is made to U.S. Pat. No. 3,852,127 entitled "Method of Manufacturing Double Diffused Transistor with Base Region Parts of Different Depths" granted Dec. 3, 1974 to J. S. Lamming.

Reference is made to U.S. Pat. No. 3,881,242 entitled "Method of Manufacturing Semiconductor Devices" granted May 6, 1975 to R. Nuttall et al.

Reference is made to U.S. Pat. No. 3,904,450, entitled "Method of Fabricating Injection Logic Ingtegrated Circuits Using Oxide Isolation" granted Sept. 9, 1975 to W. J. Evans et al.

Reference is made to U.S. Pat. No. 4,006,046 entitled "Method For Compensating for Emitter-Push Effect in the Fabrication of Transistors" granted Feb. 1, 1977 to P. C. Pravin.

Reference is made to U.S. Pat. No. 4,007,474 entitled "Transistor Having An Emitter with A Low Impurity Concentration Portion and A High Impurity Concentration Portion" granted Feb. 18, 1977 to H. Yagi et al.

Reference is made to U.S. Pat. No. 4,080,619 entitled "Bipolar Type Semiconductor Device" granted Mar. 21, 1978 to K. Suzuki.

Reference is made to U.S. Pat. No. 4,157,269 entitled "Utilizing Polysilicon Diffusion Sources and Special Masking Techniques" granted June 5, 1979 to T. H. Ning et al.

Reference is made to U.S. Pat. No. 4,160,991 entitled "High Performance Bipolar Device and Method for Making Same" granted July 10, 1979 to N. G. Anantha et al.

Reference is made to the following IBM Technical Disclosure Bulletin Publications: (1) "Method For Reducing The Emitter-Base Contact Distance in Bipolar Transistors" by C. G. Jambotkar, Vol. 19, No. 12, May 1977, pages 4601-4; and (2) "Stacking Poly-Silicon Devices For High Density LSI" by I. T. Ho and J. Riseman, Vol. 21, No. 12, May 1979, pages 48434.

Reference is made to the publication entitled "A New Polysilicon Process For A Bipolar Device—PSA Technology", by Kenji Okada et al., IEEE Transactions on Electron Devices, Vol. ED-26, No. 4, April 1979, page 385-389.

The present trend in semiconductor technology is toward large scale integration of devices with very high speed and very low power dissipation. To achieve this, it is essential that the devices be made as small as possible by (a) making the vertical junction structure shallower, and (b) reducing the horizontal geometry. Precise shallow-junction profiles can be achieved with ion implantation of dopant species and their subsequent annealing with a thermal cycle. Device horizontal geometry depends to a large extent on the lithographic tools available. Within a given lithographic constraint, however, the use of a self-aligned process can greatly improve device performance.

In a conventional (non self-aligned) process, the transistor base area must be large enough to allow for the opening of base and emitter contacts, plus sufficient leeway for the misregistrations of contacts to doped regions. Since the base area and hence the base-collector junction capacitance is a very important parameter in the performance of very fast devices, it is necessary to reduce this base area to the minimum possible value. The use of a self-aligned polysilicon base process is a powerful technique in this respect, since it (a) allows self-registration of the emitter implant to the polyslicon base contact, and (b) allows the metal base contact to be moved from the device base area onto the polysilicon, thus reducing the device base area.

SUMMARY OF THE INVENTION

The transistor structure formed by this invention is shown in FIGS. 1A, 1B and 1C. A deep trench dielectric isolation is used to isolate the device from other devices on the wafer. A shallow dielectric isolation is used to separate the collector reach-through region from the base region. A heavily doped polysilicon layer is used to dope and make contact to the transistor base region, as well as define the emitter window through which the emitter is doped. The polysilicon is covered on both top and side by a layer of slicon dioxide which is deposited by chemical vapor deposition. Contact to the polysilicon, and hence to the transistor base, is done over the deep trench dielectric isolation, thus allowing the transistor base area, and hence the collector-base capacitance, to be minimized.

In accordance with the invention and in contrast to other self-aligned processes where the intrinsic base and emitter are implanted through the same opening, the process allows the intrinsic base to be implanted first with the polyslicon as a mask. This decreases the intrinsic base resistance without affecting the emitter-base breakdown or leakage.

The process, in accordance with the invention, is inherently simple and gives well-defined vertical polysilicon sidewalls with controllable chemically vapor deposited (CVD) oxide barriers. This is very important in defining very small devices.

The process includes a single heat cycle to drive in the emitter and base. No extended heat cycles are needed to grow thick thermal oxides.

DESCRIPTION OF THE PREFERRED EMBODIMENTS

Figure 1A:
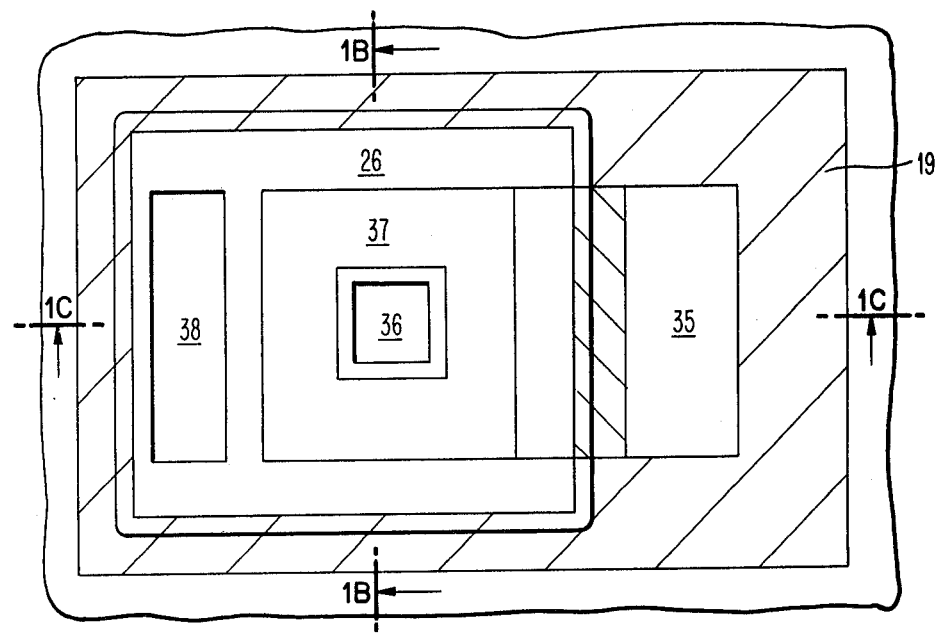
FIG. 1A is a top view of a transistor structure in accordance with the invention.
Figure 1C:
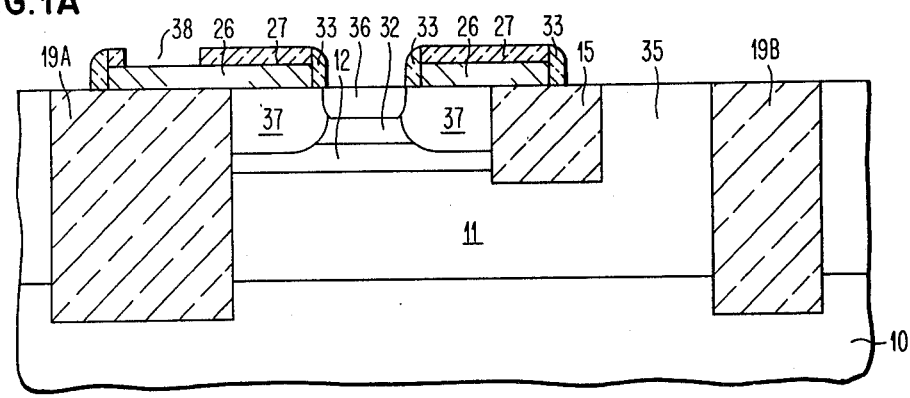
FIG. 1C is a cross-sectional view taken along the line 1C—1C of FIG. 1A.
Figure 1B:
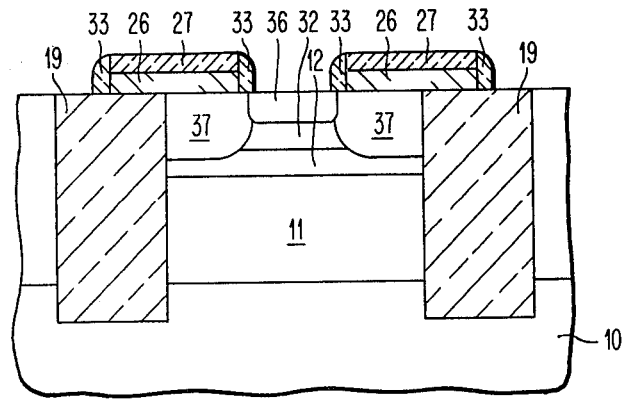
FIG. 1B is a cross-sectional view taken along the line 1B—1B of FIG. 1A.
Figure 2:
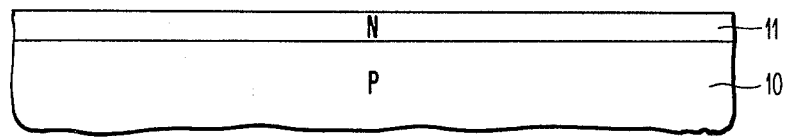
FIGS. 2 through 17 are cross-sectional views disclosing the structure at successive stages, or steps in accordance with the process of the invention.
Figure 3:
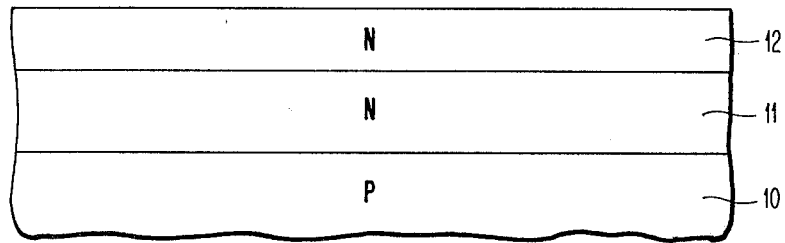
Figure 4:
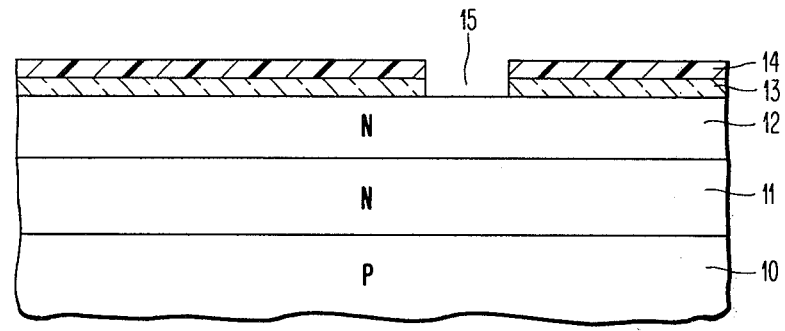

Referring now to the figures of the drawings and FIG. 2 in particular, a P-type monocrystalline silicon wafer 10 is the starting substrate. An N-type impurity is then introduced into substrate 10 forming the subcollector 11. The impurity can be any suitable N-type impurity, as for example, arsenic, and can be introduced into the wafer by any suitable technique, as for example, capsule diffusion or ion implantation. The resistivity of the N-subcollector layer 11 is approximately 0.001 ohm/cm$^2$. As shown in FIG. 3, an N-type epitaxial silicon layer 12 of approximately 1.0 micrometer to 1.5 micrometer thickness is deposited on the exposed surface. During the epitaxial deposition process, which is a high temperature process, the subcollector region 11 diffused upward into the region 12. The resistivity of the epitaxial layer is about 0.3 ohm/cm$^2$. As shown in FIG. 4, an oxide layer 13 preferably deposited by using chemical vapor deposition techniques, of approximately 3000A thickness is deposited on layer 12. A resist layer 14 is deposited over oxide layer 13 and subsequently exposed and developed to form an opening 15 which overlies the position of the shallow dielectric isolation trench to be fabricated. The resist layer 14 serves as a mask for a reactive-ion etching oxide operation. The etching is stopped when it reaches the surface of epitaxial silicon 12. The resist layer 14 is then stripped.

Figure 5:
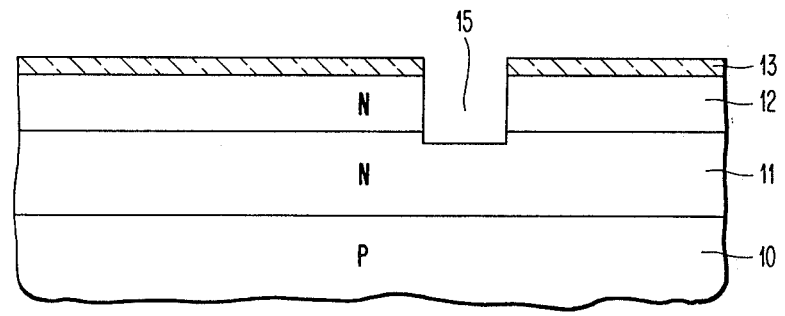

Referring to FIG. 5, using the oxide layer 13 as an etch mask, the exposed silicon in region 15 is then etched by a reactive-ion etching technique. The etching will be stopped when it reaches to the N+ subcollector region 11. The remaining oxide mask layer 13 is stripped by a chemical solution, for example, buffer-HF solution.

Figure 6:
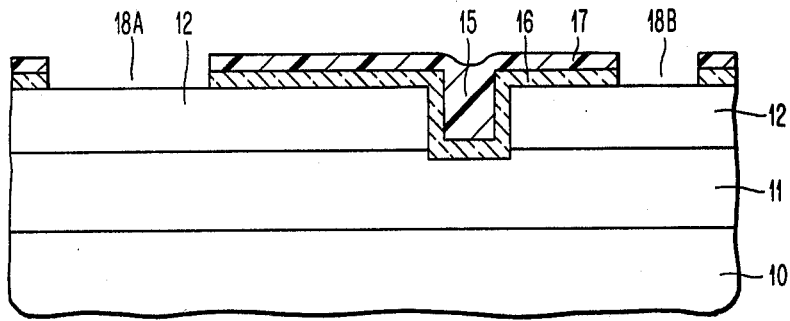

Referring to FIG. 6, a CVD oxide layer 16, approximately 6000–7000A thick, is then deposited on the wafer. A resist layer 17 is deposited and subsequently exposed and developed to form window 18A–18B which overlies the position of the deep dielectric isolation trench to be fabricated. The resist layer 17 serves as a mask for the reactive-ion etching of oxide layer 16. The etching is stopped when the silicon layer 12 is reached. The resist layer is then stripped. Using the oxide layer 16 as shown in FIG. 7, as an etch mask, the exposed silicon in window region 18A–18B is reactive-ion etched.

Figure 7:
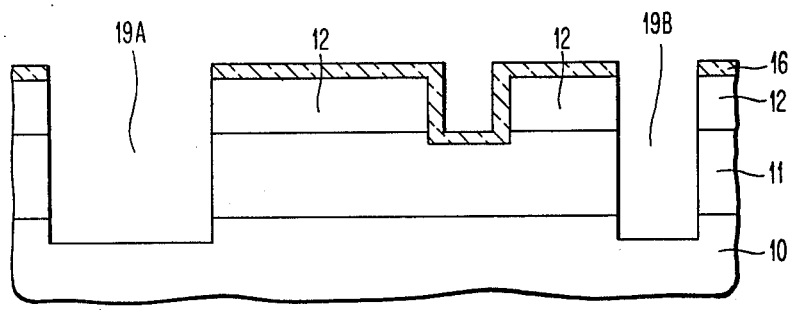

As shown in FIG. 7, the reactive ion etching of silicon is stopped when it etches through epitaxial layer 12, subcollector layer 11 and reaches into the P substrate 10 to form deep trench 19. The depth of the deep trench 19A–19B is approximately 4—5 micrometer. The remaining masking oxide 16 is then stripped.

Figure 8:
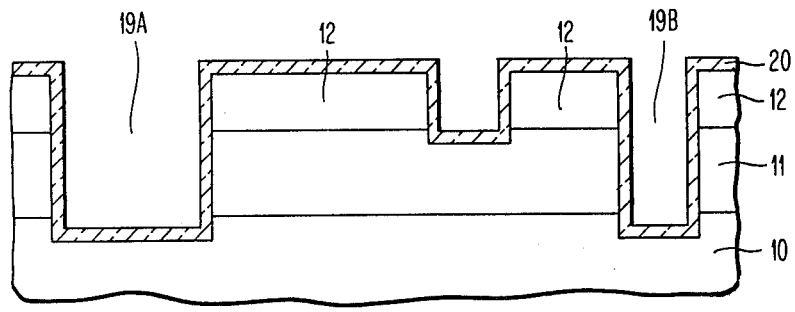

As shown in FIG. 8, the wafer is thermally oxidized to form an oxide layer 20 over the exposed silicon surface. The thickness of the thermal oxide grown is about 1000–2000A.

Figure 9:
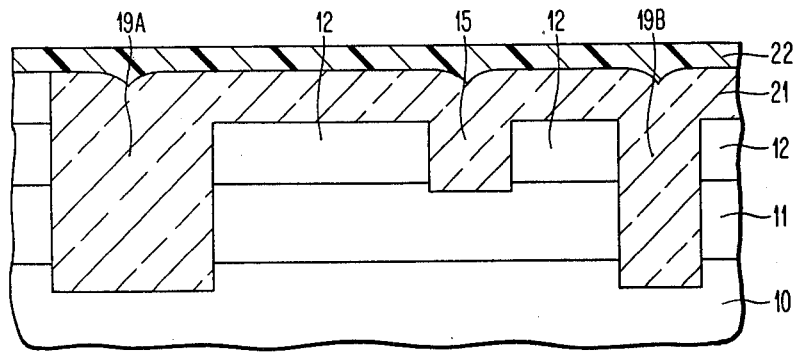
Figure 10:
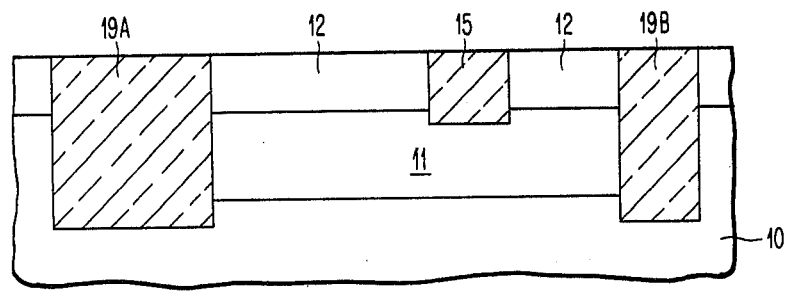

Referring to FIG. 9, a thick oxide layer 21 formed by CVD technique is used to fill the shallow trench 15 and deep trench 19A–19B and also planarize the wafer surface. For a 3 micrometer wide deep trench the oxide thickness required to overfill the trench is about 3 micrometers. As shown in FIG. 9, crevices in the center area of the overfilled trenches may be formed. In this case a blanket resist layer 22 may be applied and appropriately treated to planarize the surface 21. The subsequent process step is the use of RIE to thin back the resist layer 22 and the oxide layer 21. Of primary importance is that the etch rate of RIE resist is nearly equal to that of RIE SiO$_2$. Thus, with an equal thickness of resist and SiO$_2$ everywhere over the wafer, a back-etching to the silicon will yield a planar surface with filled in deep trench 19A–9B and shallow trench 15 as shown in FIG. 10.

Figure 11:
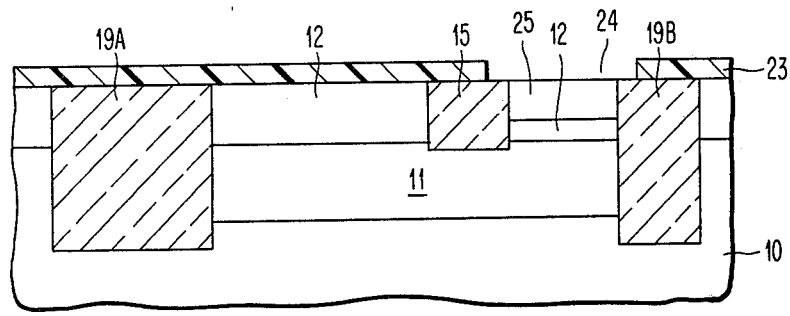

As demonstrated in FIG. 11, a resist layer 23 is deposited on the wafer surface. The resist layer 23 is exposed and developed to form a block-out opening 24 which overlies the intended transistor reach-through region. A suitable N-type impurity preferably phosphorus, is ion implanted into the epitaxial layer 12 to form reach-through region 25. The resist layer 23 is then stripped.

Figure 12:
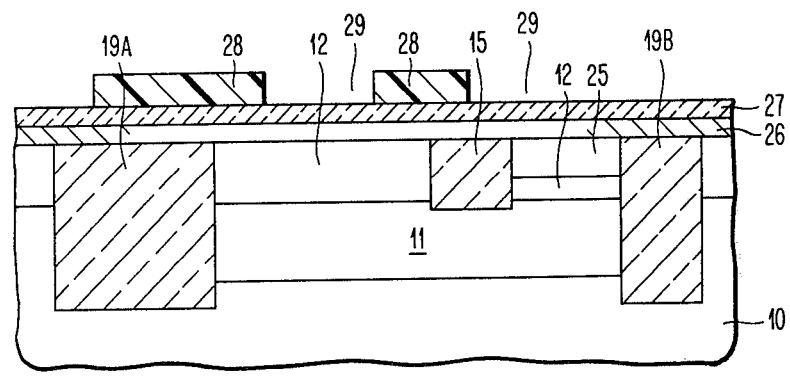
Figure 13:
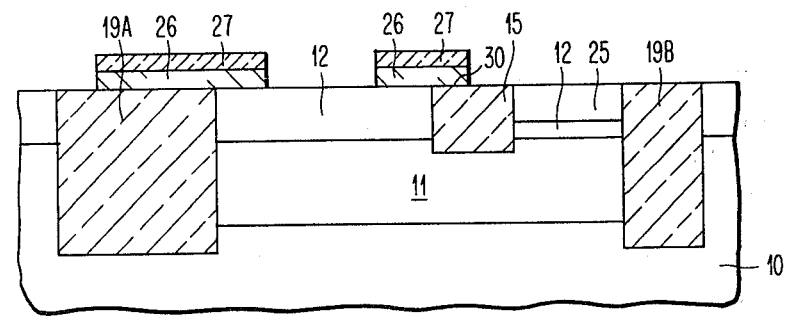

As shown in FIG. 12, a layer of polycrystalline silicon 26 of approximately 3000Å thickness is deposited by chemical vapor deposition onto the epitaxial surface 12. The polycrystalline silicon can be either in-situ doped with boron during the deposition step, or alternatively it can be doped after the deposition step by an ion implantation with boron. In either case its boron concentration should be high, of the order of 10$^{20}$ atoms per cubic centimeter. Next, a layer of silicon dioxide 27 of approximately 3000 thickness is deposited by chemical vapor deposition. Subsequently, a photoresist layer 28 is deposited on the wafer. The resist layer is then exposed and developed to form windows 29 where the oxide and polysilicon will be removed. The oxide 27 is then removed by a reactive ion etch, using the resist layer as a mask. The etch used should etch silicon dioxide much faster than resist. The resist 28 is then stripped off. Next, the polysilicon 26 is etched using the oxide 27 as a mask, with a reactive ion etch which etches silicon much faster than oxide. The device at this point is shown in FIG. 13. The polysilicon etch-stop point can be monitored at the polysilicon-oxide interface 30.

Figure 14:
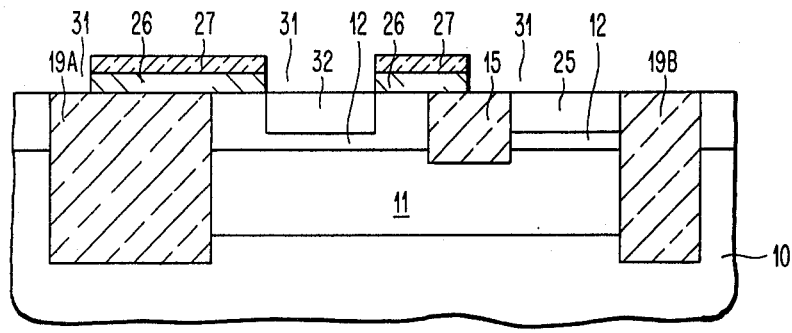

As shown in FIG. 14, a thin thermal screen oxide 31 of approximately 300Å thickness is grown on all exposed silicon surfaces. Next a low dose boron ion implantation is done to form the active base region 32. The boron implant is allowed to penetrate the reach-through region 25 also, were it will be compensated by the much higher phosphorus dose.

Figure 15:
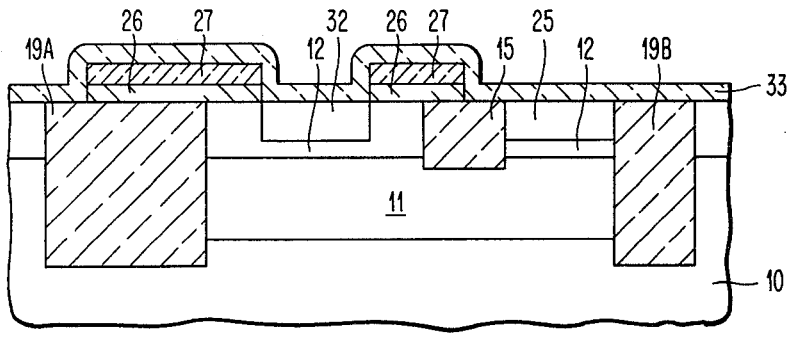
Figure 16:
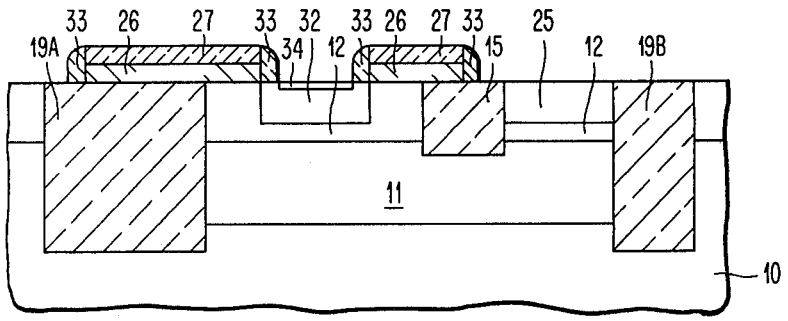

As shown in FIG. 15, a layer of silicon dioxide 33 of approximtely 3000Å thickness is deposited by chemical vapor deposition. Since such an oxide layer is highly conformal, the oxide on the sides as well as the top of the polysilicon and oxide layer (26 and 27) will be approximately 3000Å thick. The oxide layer 33 is then etched away using a reactive ion etch for which the etch rate of oxide is much faster than the etch rate of silicon. The device at this point is shown in FIG. 16.

Since the reactive ion etch is highly directional, the 3000Å thick oxide 33 on the sides of the polysilicon will remain. Next, a low-energy arsenic ion implant 34 is done to form the emitter. The arsenic implant also enters the reach-through 25 to reduce the contact resistant there. The arsenic implant is shielded from the polysilicon 26 by the oxide layer 27.

Figure 17:
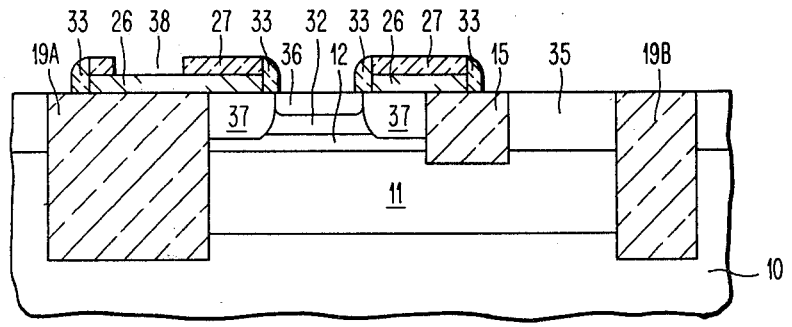

As shown in FIG. 17, a thermal cycle is done to anneal and activate the implanted reach-through 35, active base 32, and emitter 36. Simultaneously, the boron in the heavily-doped polysilicon 26 will outdiffuse to form the extrinsic base 37. Next, a base contact 38 to the polysilicon is opened by photolithography and etching. The device is now ready for deposition and fabrication of the metallurgy which will interconnect the device with other devices on the wafer. The forming of the metallurgy system is well known in the art and will not be described.

While the invention has been particularly shown and described with reference to the preferred embodiments thereof, it will be understood by those skilled in the art that various changes in form and detail may be made therein without departing from the spirit and scope of the invention.

We claim:

1. In a process for fabricating an improved bipolar transistor in a silicon substrate of a first conductivity type, said substrate having a planar surface, a subcollector region of a second conductivity type formed in said substrate, an epitaxial layer of said second conductivity type formed on said planar surface of said substrate, and first, second and third spaced apart recessed oxide isolation regions extending through said epitaxial layer into said substrate, said process including the following steps in the order recited:

(a) utilizing photolithography provide a mask (23, FIG. 11) having a window (24) on the exposed surface of said substrate, said window extending from said second recessed oxide isolation region to said third recessed oxide isolation region;

(b) ion implant ions of said second conductivity type into the portion of said epitaxial layer exposed by the window (24) inthe mask (23) to provide a collector reach through region (25, FIG. 11);

(c) remove the mask (23);

(d) chemically vapor deposit a layer (26, FIG. 12) of polycrystalline silicon on the exposed surface of said substrate, said polysilicon layer being doped in-situ with impurities of said first conductivity type said polysilicon layer (26) having a thickness of approximately 3000Å and an impurity concentration in the order of $10^{20}$ atoms per cubic centimeter;

(e) chemically vapor deposit a layer (27, FIG. 12) of silicon dioxide on said polysilicon layer (26) said chemically vapor deposited silicon dioxide layer (27) having a thickness of approximately 3000Å;

(f) utilizing photolithography provide a mask (28, FIG. 12) having first and second windows (29) on the exposed surface of the substrate, said first window exposing a portion of said silicon dioxide layer (27) spaced between said first and second spaced apart recessed oxide regions, said second window exposing a portion of said layer (27) over said collector reach-through region (25);

(g) utilizing reactive ion etch techniques remove portions of said silicon dioxide layer (27) and the underlying portions of said polysilicon layer (26) exposed by said windows (29) of mask (28) to the polysilicon oxide interface (30, FIG. 13);

(h) thermally grow a thin screen oxide (31, FIG. 14) on the exposed surface of the substrate said thin screen oxide (31) having a thickness of approximately 300Å;

(i) ion implant said exposed surface of the substrate with ions of said first conductivity type to form an intrinsic base region (32, FIG. 14);

(j) chemically vapor deposit a relatively thick oxide layer (33, FIG. 15) on the exposed surface of the substrate, said chemically vapor deposited oxide layer having a thickness of approximately 3000Å;

(k) utilizing reactive ion etching remove said relatively thick oxide layer (33) except for the sidewall portions of the layer (33, FIG. 16), these sidewall portions which define the emitter opening are not removed since reactive ion etching is highly directional said reactive ion etch of step (k) having an etch rate for oxide which is much faster than the etch rate of silicon;

(l) ion implant said exposed surface of the substrate with ions of said second conductivity type to provide an emitter region (36, FIG. 17);

(m) perform a thermal cycle to anneal and activate the implanted collector reach through region (35), the active base region (32) and the emitter region (36), also simultaneously the first conductivity type polysilicon (26, FIG. 17) will outdiffuse to form the intrinsic base region (37).

* * * * *